(12) United States Patent
Heo

(10) Patent No.: US 7,982,297 B1
(45) Date of Patent: Jul. 19, 2011

(54) STACKABLE SEMICONDUCTOR PACKAGE HAVING PARTIALLY EXPOSED SEMICONDUCTOR DIE AND METHOD OF FABRICATING THE SAME

(75) Inventor: Byong Il Heo, Buk-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 79 days.

(21) Appl. No.: 11/682,666

(22) Filed: Mar. 6, 2007

(51) Int. Cl.
*H01L 23/02* (2006.01)
*H01L 23/48* (2006.01)

(52) U.S. Cl. ......... 257/686; 257/684; 257/723; 257/777

(58) Field of Classification Search .......... 257/684–686, 257/690, 723, 737, 738, 777, 78, E23.085, 257/E23.128, E23.129, 782, E23.178, E25.006, 257/E25.013, E25.021, E25.027, 680, 787
See application file for complete search history.

(56) References Cited

U.S. PATENT DOCUMENTS

| | | |
|---|---|---|
| 2,596,993 A | 5/1952 | S.L. Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Hung Vu
(74) *Attorney, Agent, or Firm* — Stetina Brunda Garred & Brucker

(57) ABSTRACT

A semiconductor package including a package body which is uniquely configured to partially expose the semiconductor die of the package. The partial exposure of the semiconductor die enhances heat dissipation from the die. Additionally, the reduced amount of encapsulant material used in the fabrication of the semiconductor package attributable to only the partial encapsulation of the semiconductor die facilitates a reduction in the overall manufacturing cost related to the semiconductor package, and further allows one or more additional semiconductor packages to be stacked upon the package while still maintaining an overall profile of reduced thickness in the resultant stack.

18 Claims, 9 Drawing Sheets

U.S. PATENT DOCUMENTS

| | | |
|---|---|---|
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha |
| 5,434,057 A | 7/1995 | Dorian |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita et al. |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,973,935 A | 10/1999 | Schoenfeld et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |

| | | |
|---|---|---|
| 6,281,566 B1 | 8/2001 | Magni |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijinders |
| 6,476,469 B2 | 11/2002 | Huang et al. |
| 6,476,474 B1 | 11/2002 | Hung |
| 6,482,680 B1 | 11/2002 | Khor et al. |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,534,849 B1 | 3/2003 | Gang |
| 6,545,332 B2 | 4/2003 | Huang |
| 6,545,345 B1 | 4/2003 | Glenn et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,603,196 B2 | 8/2003 | Lee et al. |
| 6,624,005 B1 | 9/2003 | DiCaprio et al. |
| 6,667,546 B2 | 12/2003 | Huang et al. |
| 6,677,663 B1 | 1/2004 | Ku et al. |
| 6,700,189 B2 | 3/2004 | Shibata |
| 6,713,375 B2 | 3/2004 | Shenoy |
| 6,757,178 B2 | 6/2004 | Okabe et al. |
| 6,800,936 B2 | 10/2004 | Kosemura et al. |
| 6,867,492 B2 | 3/2005 | Auburger et al. |
| 7,005,327 B2 | 2/2006 | Kung et al. |
| 7,501,697 B2 * | 3/2009 | Yim et al. ................. 257/686 |
| 2001/0008305 A1 | 7/2001 | McClellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0163015 A1 | 11/2002 | Lee et al. |
| 2003/0030131 A1 | 2/2003 | Lee et al. |
| 2003/0073265 A1 | 4/2003 | Hu et al. |
| 2003/0198032 A1 | 10/2003 | Collander et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |
| 2004/0164387 A1 | 8/2004 | Ikenaga et al. |
| 2005/0046006 A1 * | 3/2005 | Yeom ........................... 257/686 |
| 2007/0108583 A1 | 5/2007 | Shim et al. |
| 2007/0216006 A1 | 9/2007 | Park et al. |
| 2007/0216008 A1 | 9/2007 | Gerber |
| 2007/0289777 A1 | 12/2007 | Pendse |
| 2007/0290319 A1 | 12/2007 | Kim |
| 2008/0006942 A1 | 1/2008 | Park et al. |
| 2008/0017967 A1 | 1/2008 | Bauer et al. |
| 2008/0029858 A1 | 2/2008 | Merilo et al. |
| 2008/0042251 A1 * | 2/2008 | Weng et al. ................... 257/686 |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |

| | | |
|---|---|---|
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | EP0936671 | 8/1999 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

STACKABLE SEMICONDUCTOR PACKAGE HAVING PARTIALLY EXPOSED SEMICONDUCTOR DIE AND METHOD OF FABRICATING THE SAME

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to a semiconductor package including a package body which is uniquely configured to partially expose the semiconductor die of the package for enhancing heat dissipation from the die, and to allow for the stacking of one or more additional semiconductor packages upon the package while still maintaining an overall profile of reduced thickness in the resultant stack.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die attach pad or die pad of the leadframe also remains exposed within the package body. In other semiconductor packages, the metal leadframe is substituted with a laminate substrate to which the semiconductor die is mounted and which includes pads or terminals for mimicking the functionality of the leads and establishing electrical communication with another device.

As indicated above, both the semiconductor die and the bond wires used to electrically connect the semiconductor die to the leadframe or substrate of the semiconductor package are covered by the package body thereof. Typically, the encapsulant material used to form the package body is molded such that the completed package body is substantially thicker than the roof height of the conductive wires. The package body is also molded to be relatively thick at the central area of the top surface of the semiconductor die. Typically, the pads or terminals of the semiconductor die to which the conductive wires are electrically connected are located along the peripheral edge of the semiconductor die, and not within the central area thereof. Due to the aforementioned manner in which the package body is typically formed, the thickness of the semiconductor package is increased as a whole. Moreover, as the thickness of the package body is increased, heat generated from the semiconductor die is predominantly discharged to ambient air through the leadframe or substrate, rather than through the package body. As a result, the entire heat release performance of the semiconductor package is typically poor. Further, because the encapsulant material used to form the package body is molded thick on the central area of the top surface of the semiconductor die, the quantity of the encapsulant included in the semiconductor package is increased, which in turn gives rise to an increase in the overall cost thereof.

Once the semiconductor dies have been produced and encapsulated in the semiconductor packages described above, they may be used in a wide variety of electronic devices. The variety of electronic devices utilizing semiconductor packages has grown dramatically in recent years. These devices include cellular phones, portable computers, etc. Each of these devices typically includes a printed circuit board on which a significant number of such semiconductor packages are secured to provide multiple electronic functions. These electronic devices are typically manufactured in reduced sizes and at reduced costs, which results in increased consumer demand. Accordingly, not only are semiconductor dies highly integrated, but also semiconductor packages are highly miniaturized with an increased level of package mounting density.

Even though semiconductor packages have been miniaturized, space on a printed circuit board remains limited and precious. Thus, there is a need to find a semiconductor package design to maximize the number of semiconductor packages that may be integrated into an electronic device, yet minimize the space needed to accommodate these semiconductor packages. One method to minimize space needed to accommodate the semiconductor packages is to stack the semiconductor packages on top of each other, or to stack individual semiconductor device or other devices within the package body of the semiconductor package.

With regard to stacked semiconductor packages, the term PoP (package on package) is often used to describe the arrangement wherein two semiconductor packages are vertically stacked and electrically interconnected through the use of solder balls. Within the PoP arrangement, it is possible to implement various structures, such as analogue plus digital memory, logic plus flash memory, application process plus combo memory, image processor plus memory, audio/graphic processor plus memory, etc. Accordingly, it is possible not only to make a logic device with high density, but also to obtain a memory with high capacity. However, because the individual semiconductor packages in a PoP arrangement each typically include a relatively thickly molded package body, a problem that arises is that the entire thickness of the PoP is increased. With such increase in the thickness of the PoP, it is difficult to miniaturize an electronic device in which such PoP is to be integrated. Moreover, since semiconductor packages are typically stacked in the same direction, if the thickness of the package body is excessive, the number and pitch of solder balls which can be formed on one semiconductor package to facilitate the electrical interconnection of the semiconductor packages within the PoP to each other is seriously limited. That is, assuming that an upper semiconductor package is stacked on a lower semiconductor package, the number and pitch of solder balls formed on the leadframe or substrate of the upper semiconductor package is limited by the package body formed on the lower semiconductor package. As a result, it is typically not possible to form solder balls at a given area of the upper semiconductor package corresponding to the package body of the lower semiconductor package. Therefore, the number and pitch of solder balls for electrically interconnecting the upper semiconductor package and the lower semiconductor package to each other is limited, thus rendering difficulties in designing PoP's.

The present invention addresses and overcomes these problems by providing a semiconductor package including a package body which is uniquely configured to partially expose the semiconductor die of the package for enhancing heat dissipation from the die, and to allow for the stacking of one or more additional semiconductor packages upon the package while still maintaining an overall profile of reduced thickness in the resultant stack. These, as well as other features and attributes of the present invention will be discussed in more detail below.

BRIEF SUMMARY OF THE INVENTION

I accordance with one aspect of the present invention, there is provided a semiconductor package including a package body which is uniquely configured to partially expose the semiconductor die of the package. The partial exposure of the semiconductor die enhances heat dissipation from the die. Additionally, the reduced amount of encapsulant material used in the fabrication of the semiconductor package attributable to only the partial encapsulation of the semiconductor die facilitates a reduction in the overall manufacturing cost related to the semiconductor package.

In accordance with another aspect of the present invention, there is provided a semiconductor package stack wherein at least one of the semiconductor packages of the stack includes a semiconductor package as described above having a package body which is configured to partially expose the semiconductor die of the package. The uniquely formed package body of such semiconductor package, in addition to partially exposing the semiconductor die for enhancing heat dissipation therefrom, allows for one or more additional semiconductor packages to be stacked upon the package while still maintaining an overall profile of reduced thickness in the resultant stack.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
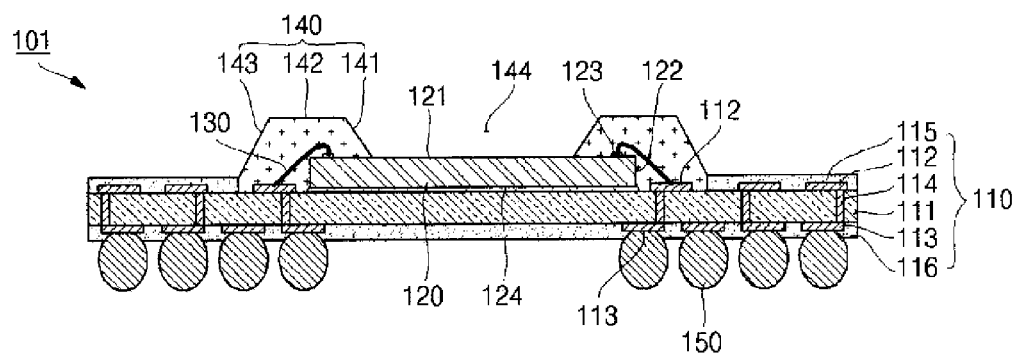
FIG. 1A is a cross-sectional view of a semiconductor package constructed in accordance with a first embodiment of the present invention.

Referring now to the drawings wherein the showings are for purposes of illustrating various embodiments of the present invention only, and not for purposes of limiting the same, FIG. 1A depicts a semiconductor package 101 constructed in accordance with a first embodiment of the present invention. The semiconductor package 101 comprises a substrate 110. The substrate 110 itself comprises a substantially flat insulation layer 111 which defines a generally planar top surface and an opposed, generally planar bottom surface. The insulation layer 111 typically has a generally quadrangular configuration defining four (4) peripheral edge segments or side surfaces. The insulation layer 111 may be formed of epoxy resin, polyimide resin, BT (bismaleimide triazine) resin, FR4 (glass fiber reinforced resin), FR5, ceramic, silicon, glass, or an equivalent thereof. However, those of ordinary skill in the art will recognize that the present invention is not limited to any particular material for the insulation layer 111.

Disposed on the top surface of the insulation layer 111 is a conductive circuit pattern 112 which may comprise pads, traces, or combinations thereof. Similarly, formed on the bottom surface of the insulation layer 111 is a plurality of conductive contacts 113. In the substrate 110, the contacts 113 are electrically connected to the circuit pattern 112 by conductive vias 114 which extend through the insulation layer 111. It is contemplated that the circuit pattern 112, contacts 113 and vias 114 may be formed of copper, gold, silver, nickel, iron, aluminum or an alloy thereof. However, those of ordinary skill in the art will recognize that the present invention is also not limited by any particular material used to form the circuit pattern 112, contacts 113 and vias 114.

In the substrate 110, portions of the top surface of the insulation layer 111 and the circuit pattern 112 formed thereon are each covered by a solder mask 115. Similarly, the bottom surface of the insulation layer 111 and a portion of each of the contacts 113 formed thereon are each covered by a solder mask 116. The solder masks 115, 116 are shown in FIG. 1A, and in FIGS. 5A-5C which depict an exemplary sequence of steps which may be used to facilitate the fabrication of the semiconductor package 101. Those of ordinary skill in the art will recognize that the substrate 110 may be formed so as not to include the solder masks 115, 116. Additionally, though the substrate 110 may be a substantially rigid or flexible printed circuit board, those of ordinary skill in the art will recognize that the substrate 110 may also comprise a conventional leadframe rather than a circuit board.

In addition to the substrate 110, the semiconductor package 101 comprises a semiconductor die 120 which is preferably bonded to the top surface of the insulation layer 111 through the use of a layer 124 of a suitable adhesive. The semiconductor die 120 defines a generally planar top surface 121 which is opposite the generally planar bottom surface thereof which is affixed to the insulation layer 111 via the layer 124 of adhesive. In addition to the top surface 121, the semiconductor die 120 defines a plurality of generally planar side surface 122 which extend generally perpendicularly between the top surface 121 and the bottom surface thereof. Typically, the semiconductor die 120 has a generally quadrangular configuration. Disposed on the top surface 121 in relative close proximity to the side surfaces 122 are a plurality of bond pads or terminals 123 of the semiconductor die 120. In the semiconductor die 120, the terminals 123 are arranged in pair of spaced, generally parallel rows which extend along respective ones of an opposed pair of the side surfaces 122. However, those of ordinary skill in the art will recognize that the semiconductor die 120 may be provided with terminals 121 which are arranged so as to extend along each of the side surfaces 122 thereof.

In the semiconductor package 101, the terminals 123 are electrically connected to the circuit pattern 112 of the substrate 110 through the use of conductive wires 130. Such wires 130 may be formed from gold wire, aluminum wire, copper wire or an equivalent thereof. However, those of ordinary skill in the art will recognize that the present invention is not limited to any particular material for the conductive wires 130. Additionally, as shown in FIG. 1A, if the solder mask 115 is included in the substrate 110, the wires 130 will typically be extended to portions of the circuit pattern 112 which are not covered by the solder mask 115, and are disposed in relative close proximity to the side surfaces 122 of the semiconductor die 120. Though not shown, it is contemplated that conventional solder bumps or gold bumps may be used instead of the wires 130 to facilitate the electrical connection of the semiconductor die 120 to the circuit pattern 112 of the substrate 110.

In the semiconductor package 101, the wires 130, a peripheral portion of the top surface 121 of the semiconductor die 120, at least two side surfaces 122 of the semiconductor die 120, a portion of the top surface of the insulation layer 111, and that portion of the circuit pattern 112 to which the wires 130 are extended are each covered by an encapsulant material which, upon hardening, forms two (2) separate and identically configured package body sections 140 of the semiconductor package 101. The semiconductor package 101 includes the two separate package body sections 140 as a result of the terminals 123 of the semiconductor die 120 being arranged on the top surface 121 in a pair of spaced, generally parallel rows as indicated above. Each package body section 140 includes a generally planar, beveled first surface 141 which extends to the top surface 121 of the semiconductor die 120, a generally planar second surface 142 which extends in spaced, generally parallel relation to the top surface 121, and a generally planar, beveled third surface 143 which extends from the second surface 142 to the top surface of the insulation layer 111. As seen in FIG. 1A, the solder mask 115, if included in the substrate 110, extends to the third surface 143 of each package body section 140. The top surface 121 of the semiconductor die 120 and the package body sections 140 (and in particular the first surfaces 141 thereof) collectively define a recess 144 which is of a predetermined depth. The use of the recess 144 will be described in more detail below.

As further seen in FIG. 1A, the package body sections 140 are formed such that the central area of the top surface 121 of the semiconductor die 120 is not covered thereby. Additionally, if only two separate package body sections 140 are included in the semiconductor package 101, the entirety or at least portions of the opposed pair of the side surfaces 122 of the semiconductor die 120 not having the terminal 123 extending therealong may also be exposed. In this regard, only peripheral portions of the top surface 121 extending along the opposed pair of the side surfaces 122 having the terminals 123 extending therealong is covered by the package body sections 140. Due to the exposure of a substantial portion of the top surface 121 of the semiconductor die 120 within the recess 144, the heat release performance of the semiconductor die 120 within the semiconductor package 101 is substantially increased. Additionally, the semiconductor package 101 may be fabricated using a reduced amount of the encapsulant material which ultimately hardens into the package body sections 140, thus reducing its cost. Though not shown, it is contemplated that a small amount of the encapsulant used to form the package body sections 140 may flow out to the central area of the top surface 121 of the semiconductor die 120 during the encapsulation process, so that a very thin layer of encapsulant may be formed and ultimately cover the top surface 121. Those of ordinary skill in the art will recognize that the separate package body sections 140 may be substituted by a single, unitary package body having a continuous, ring-like configuration in the event that the semiconductor die 120 is provided with terminals 123 which extend along each of the side surfaces 122. If such a unitary package body is included in the semiconductor package 101, it is contemplated that the cross-sectional configuration of such package body will mirror the cross-sectional configuration of each of the package body sections 140 as shown in FIG. 1A. It is further contemplated that such unitary package body will also define the above-described recess 144.

The semiconductor package 101 further comprises a plurality of solder balls 150 which are preferably deposited onto respective ones of the contacts 113 formed on the bottom surface of the insulation layer 111. As will be recognized by those of ordinary skill in the art, the solder balls 150 are used to facilitate the mounting and electrical connection of the semiconductor package 101 to a printed circuit board of an electronic device. The solder balls 150 may be formed from eutectic SnPb, Pb free solder, or an equivalent thereof. Additionally, though in FIG. 1A the solder balls 150 are depicted as being formed at only certain areas on the bottom surface of the substrate 110, those of ordinary skill in the art will recognize that the solder balls 150 may be evenly distributed over the entire area of the bottom surface of the substrate 110.

Figure 5A:
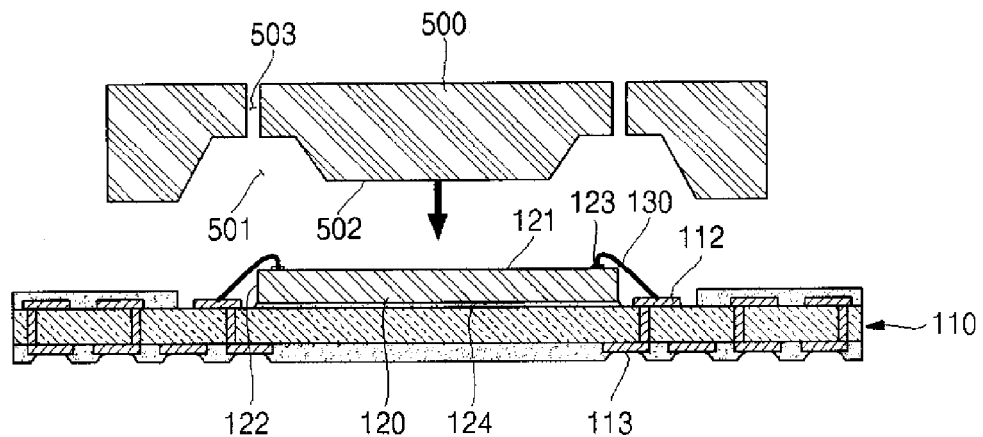
FIGS. 5A-5C depict an exemplary sequence of steps which may be used to facilitate the fabrication of the semiconductor package shown in FIG. 1A.
Figure 5B:
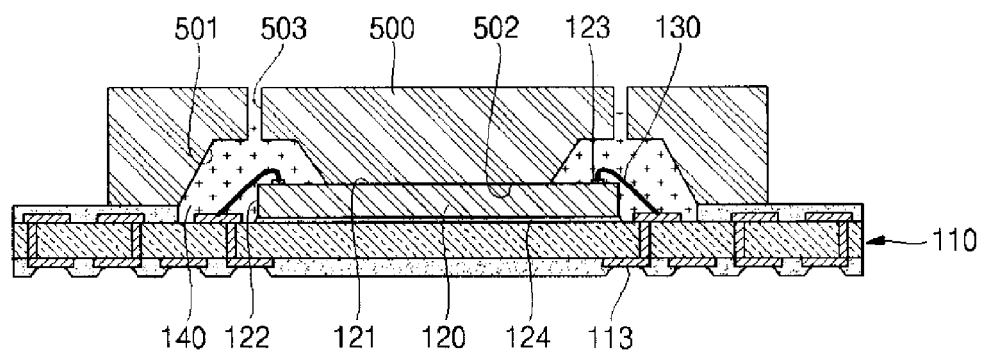
Figure 5C:
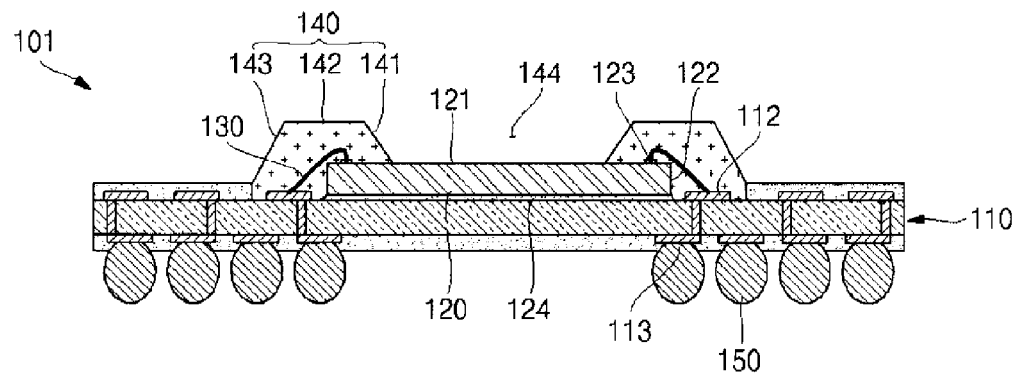

As indicated above, FIGS. 5A-5C depict an exemplary sequence of steps which may be used to facilitate the fabrication of the semiconductor package 101. In the substrate seating step shown in FIG. 5A, the substrate 110 having the semiconductor die 120 electrically connected thereto through the use of the wires 130 is seated in a mold 500. The mold 500 includes one or more cavities 501 which are formed to spatially and positionally correspond to the wires 130 used to interconnect the semiconductor die 120 to the substrate 110. The mold 500 also includes a truncated portion 502 which is formed to positionally correspond to the central area of the top surface 121 of the semiconductor die 120. Also formed within the mold 500 are apertures 503 for injecting the encapsulant material which ultimately hardens into the package body sections 140 into respective ones of the cavities 501.

In the encapsulation step shown in FIG. 5B, a suitable encapsulant material at high temperature and high pressure is injected through the holes 503 of the mold 500 so as to fill respective ones of the cavities 501. As is seen in FIG. 5B, when the injection of the encapsulant material into the mold cavities 501 occurs, the truncated projection 502 of the mold 500 is seated against the central area of the top surface 121 of the semiconductor die 120, with lower peripheral surfaces of the mold 500 being seated against the solder mask 115 of the substrate 110 which is disposed on the top surface of the insulation layer 111 thereof in the above-described manner. The injection of the encapsulant material into the cavities 501 causes the wire bonded areas on the semiconductor die 120 (i.e., the terminals 123 having the wires 130 connected thereto) to be covered and thus sealed by the encapsulant material. Also covered by the encapsulant material are peripheral portions of the top surface 121 surrounding the terminals 123, those opposed side surfaces 122 of the semiconductor die 120 along which the terminals 123 extend as indicated above, and the wires 130. The encapsulant material also covers portions of the top surface of the insulation layer 111 which are not covered by the solder mask 115, and those portions of the circuit pattern 112 to which the wires 130 extend and are electrically connected. Because the projection 502 is in close contact with the central area of the top surface 121 of the semiconductor die 120, no encapsulant material is applied to such central area of the top surface 121. However, if the contact force between the projection 502 and the central area of the top surface 121 is not particularly high, a small amount of the encapsulant material may be caused to flow over the central area of the top surface 121. As a result, a thin layer of the encapsulant material may be formed over the central area of the top surface 121 as also explained above.

Upon the removal of the fully formed package body sections 140 from within the mold 500, the exposed central area of the top surface 121 of the semiconductor die 120 and the package body sections 140 collectively define the recess 144 which is of predetermined volume as indicated above. Thereafter, in a solder ball reflow step as shown in FIG. 5C, volatile flux is dotted onto those portions of the contacts 113 not covered by the solder mask 116 applied to the bottom surface of the insulation layer 111 in the substrate 110. Thereafter, a plurality of solder balls 150 are temporarily bonded to respective ones of the contacts 113. If the substrate 110 with the temporarily bonded solder balls 150 is thereafter put into and taken out of a suitable furnace, the solder balls 150 melt and solidify, thereby being rigidly fixed to the contacts 113. The flux is volatized and completely removed. The solder ball reflow step is preferably performed in a state in which the substrate 110 is inverted. The semiconductor package 101 completely fabricated in the above-described manner can be electrically connected to various types of electronic appliances through the use of the solder balls 150.

Figure 1B:
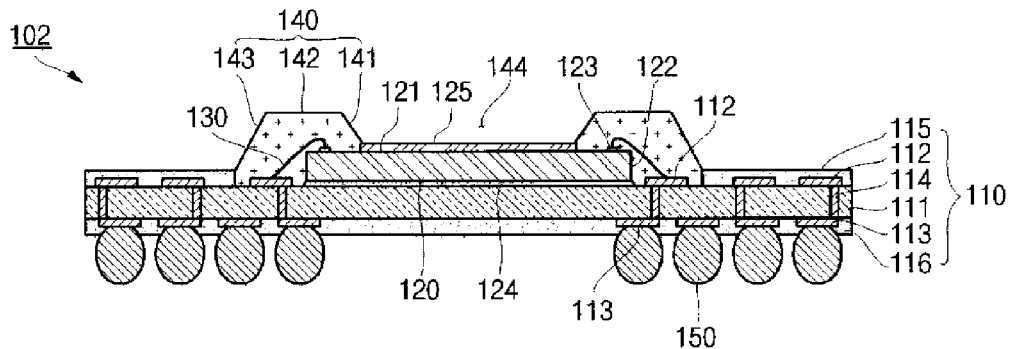
FIG. 1B is a cross-sectional view of a variant of the semiconductor package shown in FIG. 1A.

Referring now to FIG. 1B, there is shown a semiconductor package 102 which comprises a relatively minor variant of the semiconductor package 101 shown in FIG. 1A. In this regard, only the distinctions between the semiconductor packages 101, 102 will be described below. In the semiconductor package 102, a protective layer 125 of predetermined thickness is formed on the exposed central area of the top surface 121 of the semiconductor die 120. Such protective layer 125 may be formed from a polymer, glassivation or an equivalent thereto. In addition, the protective layer 125 may be formed from any material which attaches well to the semiconductor die 120 and encapsulant 140. Furthermore, the protective layer 125 may be formed from a thermal conductor so as to further improve the heat release performance of the semiconductor die 120. Such a thermal conductor may not only be fabricated from a conventional metallic material, but also from a non-metallic material. Moreover, it is contemplated that the protective layer 125 may extend to the first surfaces 141 of the package body sections 140, or may be spaced inwardly from such first surfaces 141.

Figure 6A:
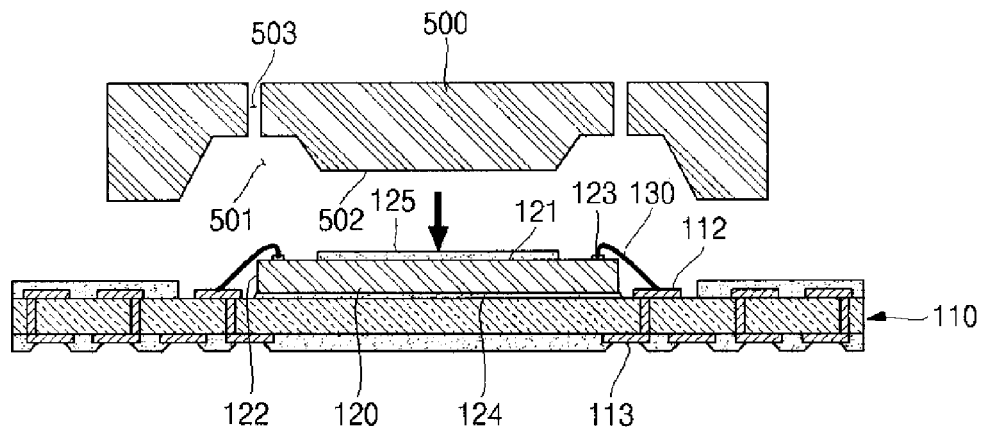
FIGS. 6A-6C depict an exemplary sequence of steps which may be used to facilitate the fabrication of the semiconductor package shown in FIG. 1B.
Figure 6B:
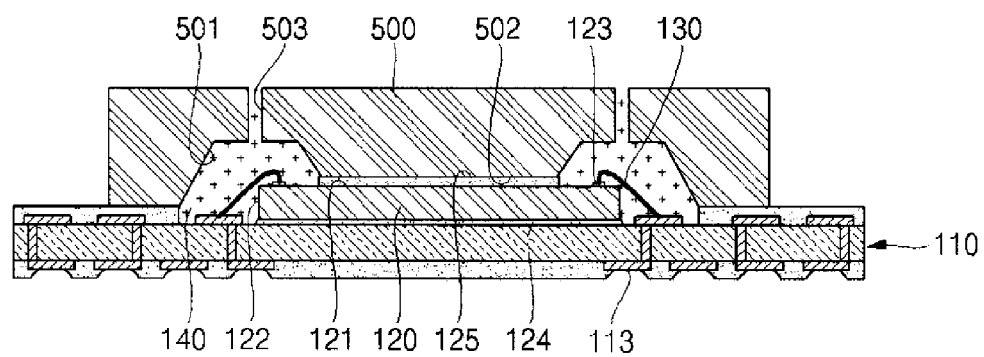
Figure 6C:
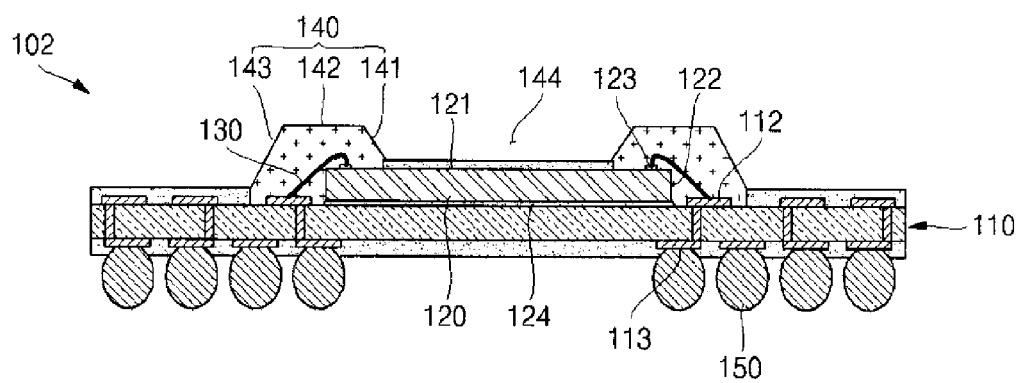

Referring now to FIGS. 6A-6C, there is shown an exemplary sequence of steps which may be used to facilitate the fabrication of the semiconductor package 102 shown in FIG. 1B. The fabrication methodology for the semiconductor package 102 shown in FIGS. 6A-6C is identical to that shown and described above in relation to FIGS. 5A-5C, with the sole distinction being that the projection 502 of the mold 500 comes into close contact with the protective layer 125 applied to the central area of the top surface 121 of the semiconductor die 120 in the fabrication process related to the semiconductor package 102, as opposed to being directly engaged to the top surface 121. Advantageously, the engagement of the projection 502 to the protective layer 125 as opposed to the top surface 121 itself assists in protecting the semiconductor die 120 from damage attributable to the engagement of the mold 500 thereto. The protective layer 125 such as the polymer may be attached or dispensed to the first surface 121 of the semiconductor die 120 by shape of the adhesive tape or a liquid adhesive before the encapsulation. Moreover, the protective layer 125 such as the glassivation may be formed to the first surface 121 of the semiconductor die 120 by using chemical vapor deposition. Namely, silicon or nitride may be deposited to the first surface 121 of the semiconductor die 120.

Figure 7A:
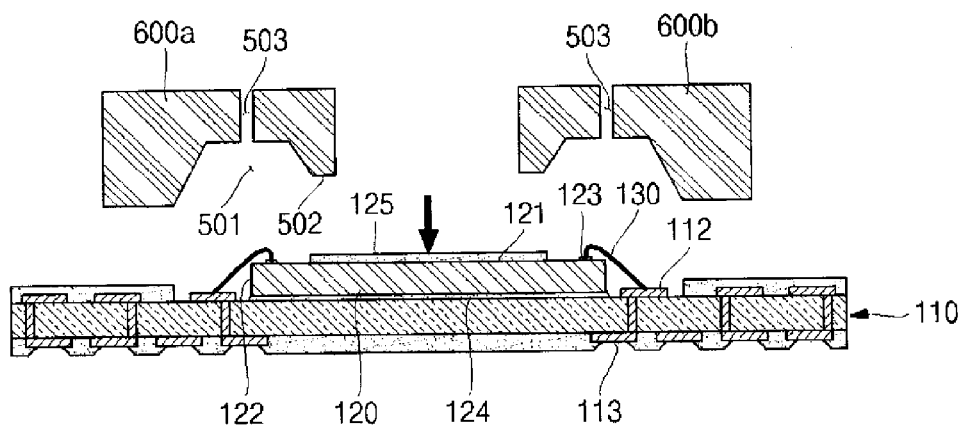
FIGS. 7A-7C depict an exemplary sequence of steps which may be used to facilitate the fabrication of the semiconductor package shown in FIG. 1B as an alternative to the steps shown in FIGS. 6A-6C.
Figure 7B:
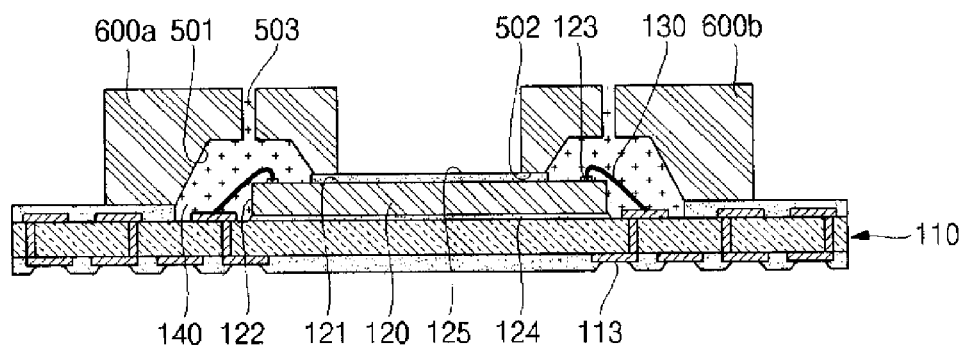
Figure 7C:
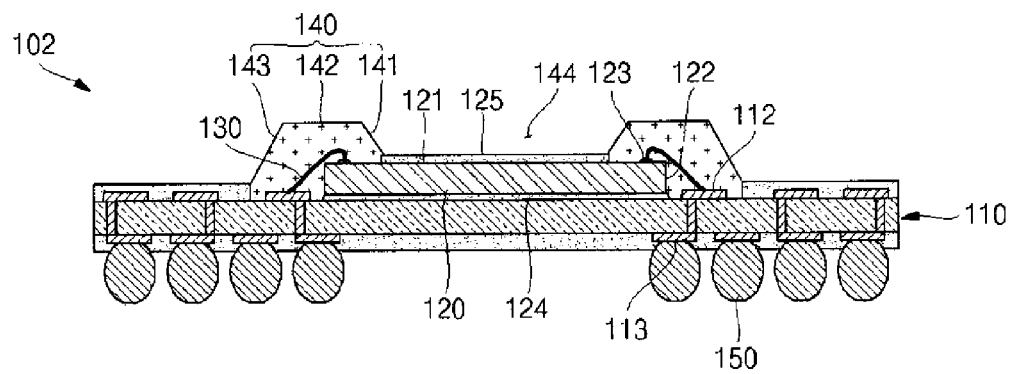

Referring now to FIGS. 7A-7C, there is shown an exemplary sequence of steps which may be used to facilitate the fabrication of the semiconductor package 102 shown in FIG. 1B as an alternative to the fabrication methodology shown in FIGS. 6A-6C discussed above. The fabrication methodology shown in FIGS. 7A-7C is virtually identical to that shown in FIGS. 6A-6C, with the sole distinction lying in the above-described one piece type mold 500 being replaced with separate mold sections 600a, 600b. As will be recognized by those of ordinary skill in the art, the mold section 600a, 600b, when cooperatively engaged to the substrate 110 and to the semiconductor die 120 in the proper manner, facilitate the formation of respective ones of the package body sections 140 of the semiconductor package 102. The primary advantage attendant to the use of the separate mold sections 600a, 600b as an alternative to the above-described mold 500 is that the use of the separate mold section 600a, 600b rarely causes the possibility of poor molding such as mold flash and incomplete molding as compared with a one piece type mold.

As seen in FIG. 7B, when the separate mold sections 600a, 600b are used in lieu of the above-described mold 500, a lower peripheral surface of each of the mold sections 600a, 600b is seated against the protective layer 125 disposed on the top surface 121 of the semiconductor die 120. Those of ordinary skill in the art will recognize that the use of the mold sections 600a, 600b as an alternative to the mold 500 is also applicable to the fabrication of the semiconductor package 101 shown in FIG. 1A. If used to facilitate the fabrication of the semiconductor package 101, it will further be appreciated that a lower peripheral surface of each of the mold sections 600a, 600b will be firmly seated directly against the top surface 121 of the semiconductor die 120 since no protective layer 125 is included on the top surface 121 in the semiconductor package 101. Further, though two mold sections 600a, 600b are shown in FIGS. 7A-7C, those of ordinary skill in the art will recognize that more than two mold sections may be used to facilitate the fabrication of a semiconductor package wherein the semiconductor die 120 of such semiconductor package includes terminals 123 which extend along more than two of the side surfaces 122 defined thereby.

Figure 2A:
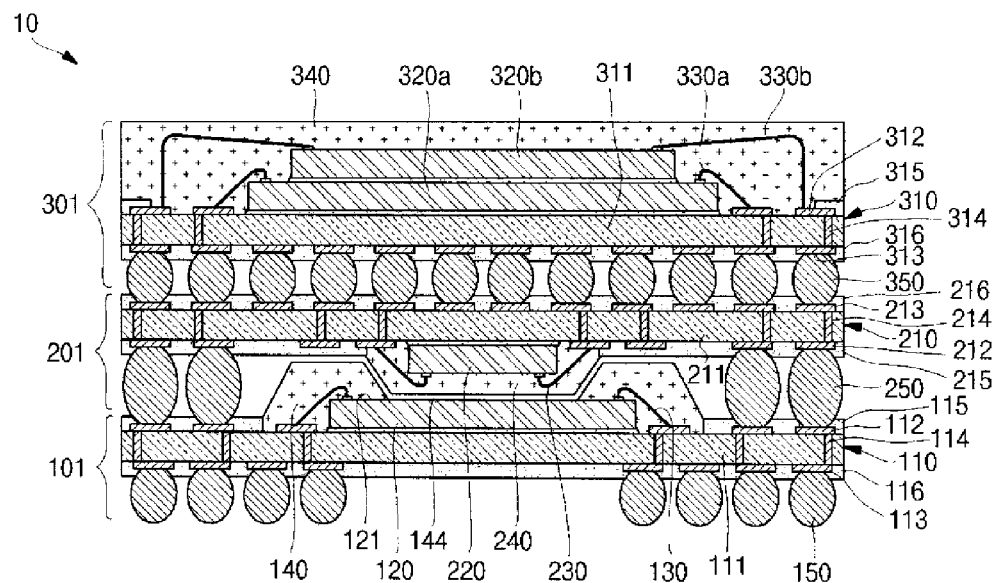
FIG. 2A is a cross-sectional view of a chip stack assembled to include one of semiconductor packages shown in FIG. 1A.
Figure 8:
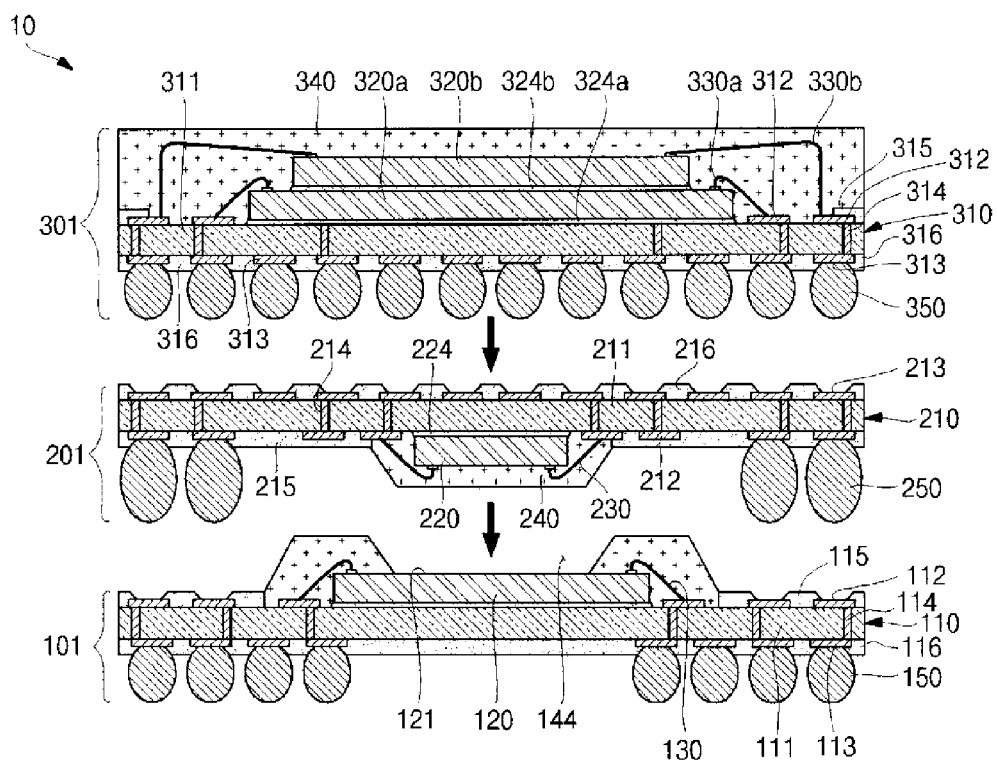
FIG. 8 is an exploded view of the chip stack shown in FIG. 2A.

Referring now to FIG. 2A, there is shown a semiconductor package stack 10 which is assembled to include the semiconductor package 101 shown and described above in relation to FIG. 1A. An exploded view of the stack 10 is shown in FIG. 8. The stack 10 shown in FIGS. 2A and 8 includes three (3) vertically stacked semiconductor packages 101, 201, 301. Of these, the semiconductor package 101 constitutes the lowermost semiconductor package in the stack 10. Stacked upon the semiconductor package 101 is a semiconductor package 201. The semiconductor package 201 includes a substrate 210 having a construction which is virtually identical to that of the substrate 110 of the semiconductor package 101. In this regard, the 200 series reference numerals included in FIGS. 2A and 8 correspond to respective ones of the 100 series reference numerals included in FIGS. 1A, 2A and 8. In the semiconductor package 201, attached to the top surface of the substrate 210 is a semiconductor die 220, the terminals of which are electrically connected to portions of the circuit pattern 212 not covered by the solder mask 215 through the use of conductive wires 230. An adhesive layer 224 is used to attach the semiconductor die 220 to the substrate 210, and in particular to the top surface of the insulation layer 211 thereof. The semiconductor die 220, wires 230, a portion of the top surface of the insulation layer 211, and those portions of the circuit pattern 212 not covered by the solder mask 215 are each covered by a package body 240 of the semiconductor package 201 which is formed from a hardened encapsulant material. Importantly, the package body 240 has a configuration which is complementary to that of the recess 144 of the semiconductor package 101 for reasons which will be discussed in more detail below.

In the stack 10, solder balls 250 which may be preformed on prescribed portions of the circuit pattern 212 of the semiconductor package 201 are used to electrically connect the circuit pattern 212 of the semiconductor package 201 to the circuit pattern 112 of the semiconductor package 101 in the manner shown in FIGS. 2A and 8. In this regard, it is contemplated that if the semiconductor package 101 is to be integrated into the stack 10, the solder mask 115 may be altered slightly from the form shown in FIG. 1A to that shown in FIG. 8 such that prescribed peripheral portions of the circuit pattern 112 are not covered by the solder mask 115 and thus remain exposed so as to more easily facilitate the interface of the solder balls 250 thereto. The solder balls 250 are sized such that when the semiconductor package 201 is electrically connected to the semiconductor package 101 through the use thereof, the package body 240 of the semiconductor package 201 is nested within the recess 144 of the semiconductor package 101 in the manner shown in FIG. 2A. In the stack 10, it is preferable that a slight gap or space be defined between the package body 240 and the top surface 121 of the semiconductor die 120 and package body sections 140 of the semiconductor package 101 for the purpose of defining an airflow passage between the stacked semiconductor packages 101, 201, thereby improving the heat release performance thereof. However, it is contemplated that the package body 240 may directly engage the top surface 121 of the semiconductor die 120. Advantageously, the receipt of the package body 240 of the semiconductor package 201 into the complimentary recess 144 of the underlying semiconductor package 101 reduces the overall thickness of the stack semiconductor packages 101, 201. In this regard, the stack thickness of the semiconductor packages 101, 201 is reduced by the depth of the recess 144 defined by the semiconductor package 101. As will be recognized, the solder balls 250 used to electrically connect the semiconductor packages 101, 201 to each other in the stack 10 are sized as necessary to achieve the desired gap or clearance between the package body 240 and the top surface 121 of the semiconductor die 120.

As indicated above, also included in the stack 10 is the semiconductor package 301 which is vertically stacked upon the semiconductor package 201. The semiconductor package 301 includes a substrate 310 which is also substantially identical in construction to the above-described substrate 110. In this regard, the 300 series reference numerals included in FIGS. 2A and 8 also correspond to respective ones of the 100 series reference numerals included in FIGS. 1A, 2A and 8. In the semiconductor package 301, attached to the top surface of the insulation layer 311 of the substrate 310 through the use of a first layer 324*a* of an adhesive is a first semiconductor die 320*a*. Attached to the top surface of the first semiconductor die 320*a* via a second layer 324*b* of a suitable adhesive is a second semiconductor die 320*b*. The terminals of the lower first semiconductor die 320*a* are electrically connected to exposed portions of the circuit pattern 312 not covered by the solder mask 315 through the use of conductive wires 330*a*. Similarly, the terminals of the upper semiconductor die 320*b* stacked upon the lower semiconductor die 320*a* are electrically connected to exposed portions of the circuit pattern 312 not covered by the solder mask 315 through the use of conductive wires 330*b*. In the semiconductor package 301, the first and second semiconductor dies 320*a*, 320*b*, the conductive wires 330*a*, 330*b*, those portions of the circuit pattern 312 not covered by the solder mask 315, and an exposed portion of the top surface of the insulation layer 311 of the substrate 310 are each covered by a package body 340. The package body 340 is sized so as to extend in substantially flush relation to each of the peripheral edges or side surfaces defined by the insulation layer 311 of the substrate 310, as shown in FIGS. 2A and 8.

In the stack 10, solder balls 350 are used to electrically connect the contacts 313 of the semiconductor package 301 to the contacts 213 of the underlying semiconductor package 201. In this regard, it is contemplated that the semiconductor package 301 will be fabricated to include the solder balls 350 which are formed on those portions of respective ones of the contacts 313 which are exposed in the solder mask 316. The solder balls 350 are then mated and electrically connected to those portions of respective ones of the contacts 213 which are exposed in the solder mask 216 of the semiconductor package 201 in the manner shown in FIG. 2A. Since the semiconductor package 201 is inverted when electrically connected to the semiconductor package 101, a full array of the contacts 213 may be formed on the bottom surface of the insulation layer 211 of the substrate 210, the contacts 213 thus covering almost the entirety of the bottom surface of the insulation layer 211. Accordingly, the contacts 313 may likewise be formed on the bottom surface of the insulation layer 311 of the substrate 310 as a full array in the semiconductor package 301, thus also covering virtually the entirety of the bottom surface of the insulation layer 311 of the substrate 310. As a result, in the stack 10, a greater number of electrical connection areas may be created between the stacked semiconductor packages 201, 301, thus resulting in greater ease in the design and implementation of desired logic functions. Those of ordinary skill in the art will recognize that the semiconductor package 301 as shown in FIGS. 2A and 8 is merely an example, the present invention not being limited to the form of the semiconductor package 301 as described above. In this regard, the semiconductor package 301 may be a conventional semiconductor package which includes only a single semiconductor die, and not the stacked first and second semiconductor dies 320a, 320b described above. Along these lines, the structural attributes of the semiconductor package 201 described above is also exemplary only, the present invention not being limited to the above-described form for the semiconductor package 201.

Figure 2B:
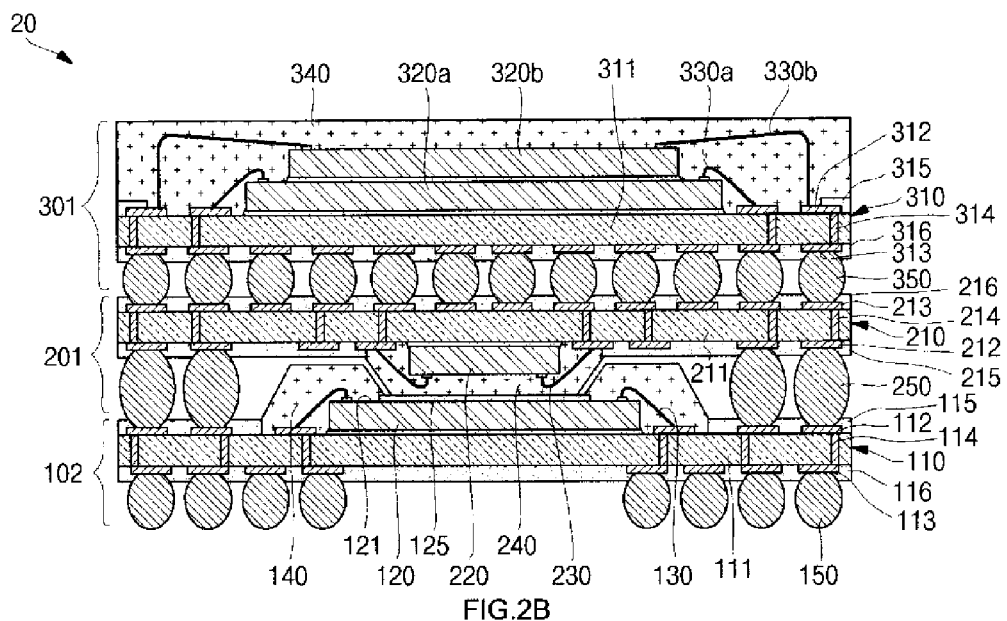
FIG. 2B is a cross-sectional view of a variant of the chip stack shown in FIG. 2A and assembled to include one of semiconductor packages shown in FIG. 1B.
Figure 9:
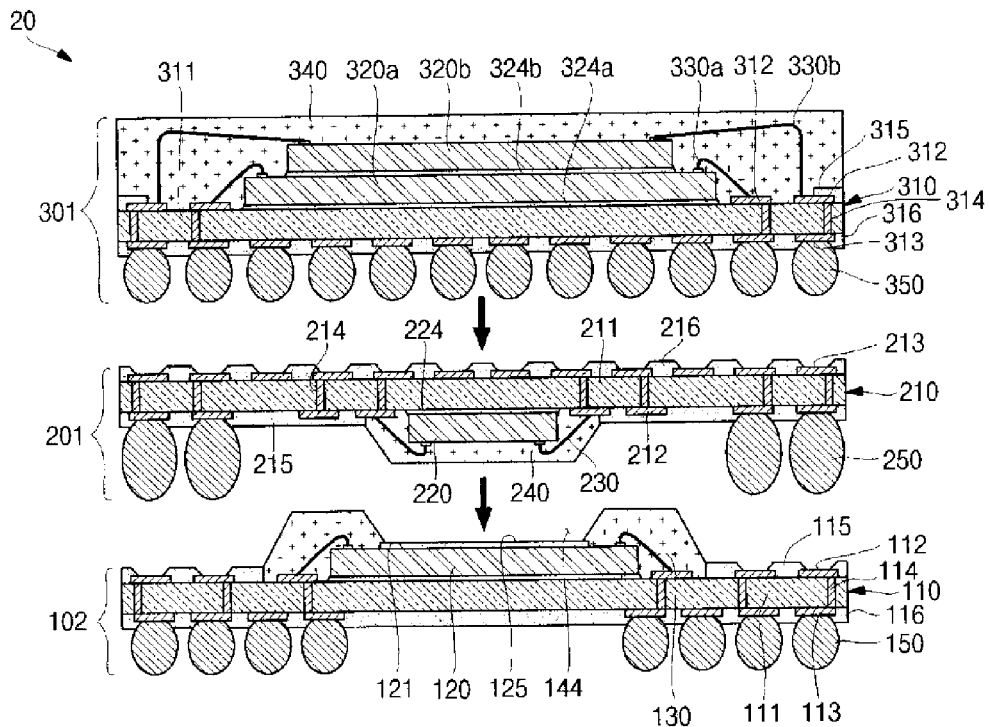
FIG. 9 is an exploded view of the chip stack shown in FIG. 2B.

Referring now to FIG. 2B, there is shown a semiconductor package stack 20 which comprises a relatively minor variant of the semiconductor package stack 10 shown in FIG. 2A. FIG. 9 provides an exploded view of the stack 20 shown in FIG. 2B. The only distinction between the stacks 10, 20 is that the semiconductor package 101 in the stack 10 is substituted with the semiconductor package 102 shown in FIG. 1B in the stack 20. Thus, in the stack 20, when the semiconductor package 201 is vertically stacked upon and electrically connected to the underlying semiconductor package 102, the package body 240 of the semiconductor package 201 will typically directly engage the protective layer 125 disposed on the top surface 121 of the semiconductor die 120 in the underlying semiconductor package 102 in the manner shown in FIG. 2B.

Figure 3A:
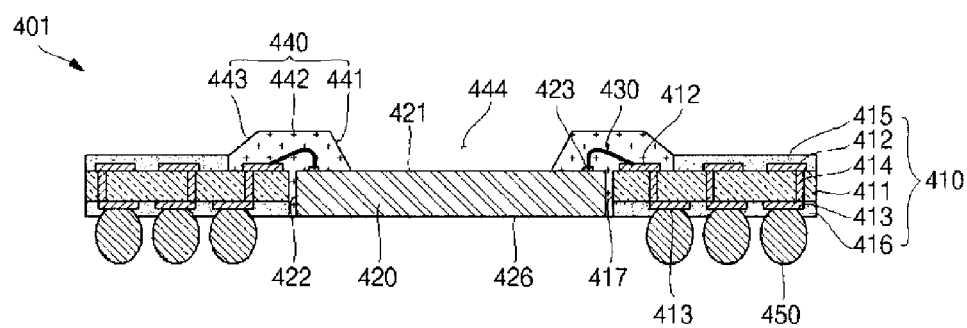
FIG. 3A is a cross-sectional view of a semiconductor package constructed in accordance with a second embodiment of the present invention.

Referring now to FIG. 3A, there is depicted a semiconductor package 401 constructed in accordance with a second embodiment of the present invention. The semiconductor package 401 comprises a substrate 410. The substrate 410 itself comprises a substantially flat insulation layer 411 which defines a generally planar top surface and an opposed, generally planar bottom surface. The insulation layer 411 typically has a generally quadrangular configuration defining four (4) peripheral edge segments or side surfaces. The insulation layer 411 may be formed of epoxy resin, polyimide resin, BT (bismaleimide triazine) resin, FR4 (glass fiber reinforced resin), FR5, ceramic, silicon, glass, or an equivalent thereof. However, those of ordinary skill in the art will recognize that the present invention is not limited to any particular material for the insulation layer 411.

Disposed on the top surface of the insulation layer 411 is a conductive circuit pattern 412 which may comprise pads, traces, or combinations thereof. Similarly, formed on the bottom surface of the insulation layer 411 is a plurality of conductive contacts 413. In the substrate 410, the contacts 413 are electrically connected to the circuit pattern 412 by conductive vias 414 which extend through the insulation layer 411. It is contemplated that the circuit pattern 412, contacts 413 and vias 414 may be formed of copper, gold, silver, nickel, iron, aluminum or an alloy thereof. However, those of ordinary skill in the art will recognize that the present invention is also not limited by any particular material used to form the circuit pattern 412, contacts 413 and vias 414.

In the substrate 410 as shown in FIG. 3A, portions of the top surface of the insulation layer 411 and the circuit pattern 412 formed thereon are each covered by a solder mask 415. Similarly, the bottom surface of the insulation layer 411 and a portion of each of the contacts 413 formed thereon are each covered by a solder mask 416. Those of ordinary skill in the art will recognize that the substrate 410 may be formed so as not to include the solder masks 415, 416. Disposed in the approximate center of the insulation layer 411 of the substrate 410 is an opening 417 which may have a quadrangular configuration and extends between the top and bottom surfaces of the insulation layer 411. The use of the opening 417 will be discussed in detail below. Though the substrate 410 may be a substantially rigid or flexible printed circuit board, those of ordinary skill in the art will recognize that the substrate 410 may also comprise a conventional leadframe rather than a circuit board.

In addition to the substrate 410, the semiconductor package 401 comprises a semiconductor die 420 which is disposed within the opening 417 of the substrate 410 in the manner shown in FIG. 3A. The semiconductor die 420 defines a generally planar top surface 421 which extends in generally parallel relation to the top surface of the insulation layer 411 when the semiconductor die 420 is properly positioned within the opening 417. The semiconductor die also defines a generally planar bottom surface 426 which is disposed in opposed relation to the top surface 421 and extends in generally parallel relation to the solder mask 416 applied to the bottom surface of the insulation layer 411 when the semiconductor die 420 is properly positioned within the opening 417. In addition to the top and bottom surfaces 421, 426, the semiconductor die 420 defines a plurality of generally planar side surface 422 which extend generally perpendicularly between the top surface 421 and the bottom surface 426 thereof. Typically, the semiconductor die 420 also has a generally quadrangular configuration. Disposed on the top surface 421 in relative close proximity to the side surfaces 422 are a plurality of bond pads or terminals 423 of the semiconductor die 420. In the semiconductor die 420, the terminals 423 are arranged in pair of spaced, generally parallel rows which extend along respective ones of an opposed pair of the side surfaces 422. However, those of ordinary skill in the art will recognize that the semiconductor die 420 may be provided with terminals 421 which are arranged so as to extend along each of the side surfaces 422 thereof.

In the semiconductor package 401, the terminals 423 are electrically connected to the circuit pattern 412 of the substrate 410 through the use of conductive wires 430. Such wires 430 may be formed from gold wire, aluminum wire, copper wire or an equivalent thereof. However, those of ordinary skill in the art will recognize that the present invention is not limited to any particular material for the conductive wires 430. Additionally, as shown in FIG. 3A, if the solder mask 415 is included in the substrate 410, the wires 430 will typically be extended to portions of the circuit pattern 412 which are not covered by the solder mask 415, and are disposed in relative close proximity to the side surfaces 422 of the semiconductor die 420.

In the semiconductor package 401, the wires 430, a peripheral portion of the top surface 421 of the semiconductor die 420, at least two (and preferably all) of the side surfaces 422 of the semiconductor die 120, a portion of the top surface of the insulation layer 411, and that portion of the circuit pattern 412 to which the wires 430 are extended are each covered by an encapsulant material which, upon hardening, forms two (2) identically configured package body sections 440 of the semiconductor package 401. The semiconductor package 401 includes the two package body sections 440 as a result of the terminals 423 of the semiconductor die 420 being arranged on the top surface 421 in a pair of spaced, generally parallel rows as indicated above. Each package body section 440 includes a generally planar, beveled first surface 441 which extends to the top surface 421 of the semiconductor 420, a generally planar second surface 442 which extends in spaced, generally parallel relation to the top surface 421, and a generally planar, beveled third surface 443 which extends from the second surface 442 to the top surface of the insulation layer 411. As seen in FIG. 3A, the solder mask 415, if included in the substrate 410, extends to the third surface 443 of each package body section 440. The top surface 421 of the semiconductor die 420 and the package body sections 440

(and in particular the first surfaces 441 thereof) collectively define a recess 444 which is of a predetermined depth. The use of the recess 444 will be described in more detail below.

As further seen in FIG. 3A, the package body sections 440 are formed such that the central area of the top surface 421 of the semiconductor die 420 is not covered thereby. Additionally, if only two package body sections 440 are included in the semiconductor package 401, only peripheral portions of the top surface 421 extending along the opposed pair of the side surfaces 422 having the terminals 423 extending therealong may be covered by the package body sections 440. Due to the exposure of a substantial portion of the top surface 421 of the semiconductor die 420 within the recess 444, the heat release performance of the semiconductor die 420 within the semiconductor package 401 is substantially increased. Additionally, the semiconductor package 401 may be fabricated using a reduced amount of the encapsulant material which ultimately hardens into the package body sections 440, thus reducing its cost. Though not shown, it is contemplated that a small amount of the encapsulant used to form the package body sections 440 may flow out to the central area of the top surface 421 of the semiconductor die 420 during the encapsulation process, so that a very thin layer of encapsulant may be formed and ultimately cover the top surface 421. Those of ordinary skill in the art will recognize that the package body sections 440 may be substituted by a single, unitary package body having a continuous, ring-like configuration in the event that the semiconductor die 420 is provided with terminals 423 which extend along each of the side surfaces 422. If such a unitary package body is included in the semiconductor package 401, it is contemplated that the cross-sectional configuration of such package body will mirror the cross-sectional configuration of each of the package body sections 440 as shown in FIG. 3A. It is further contemplated that such unitary package body will also define the above-described recess 444.

The semiconductor package 401 further comprises a plurality of solder balls 450 which are preferably deposited onto respective ones of the contacts 413 formed on the bottom surface of the insulation layer 411. As will be recognized by those of ordinary skill in the art, the solder balls 450 are used to facilitate the mounting and electrical connection of the semiconductor package 401 to a printed circuit board of an electronic device. The solder balls 450 may be formed from eutectic SnPb, Pb free solder, or an equivalent thereof. Though not shown, it is contemplated that a sequence of steps mirroring those as shown and described above in relation to FIGS. 5A-5C may be used to facilitate the fabrication of the semiconductor package 401.

Figure 3B:
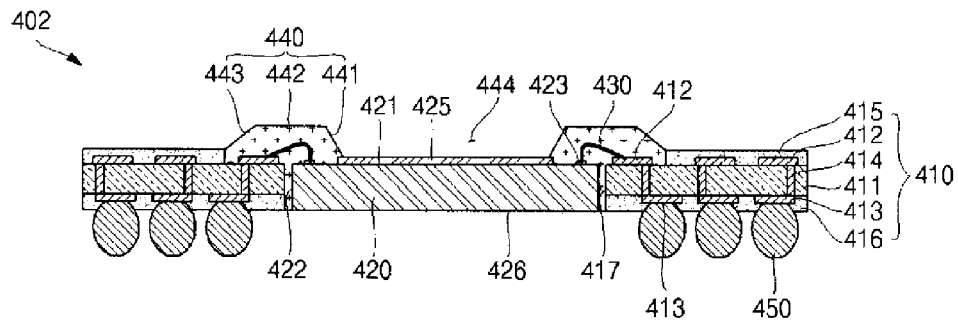
FIG. 3B is a cross-sectional view of a variant of the semiconductor package shown in FIG. 3A.

Referring now to FIG. 3B, there is shown a semiconductor package 402 which comprises a relatively minor variant of the semiconductor package 401 shown in FIG. 3A. In this regard, only the distinctions between the semiconductor packages 401, 402 will be described below. In the semiconductor package 402, a protective layer 425 of predetermined thickness is formed on the exposed central area of the top surface 421 of the semiconductor die 420. Such protective layer 425 may be formed from a polymer or an equivalent thereto. Furthermore, the protective layer 425 may be formed from a thermal conductor so as to further improve the heat release performance of the semiconductor die 420. Such a thermal conductor may not only be fabricated from a conventional metallic material, but also from a non-metallic material. Moreover, it is contemplated that the protective layer 425 may extend to the first surfaces 441 of the package body sections 440, or may be spaced inwardly from such first surfaces 441. Though not shown, it is contemplated that a sequence of steps mirroring those as shown and described above in relation to FIGS. 6A-6C and 7A-7C may be used to facilitate the fabrication of the semiconductor package 402. The sequence of steps shown in FIGS. 7A-7C may also be used to facilitate the fabrication of the semiconductor package 401.

Figure 4A:
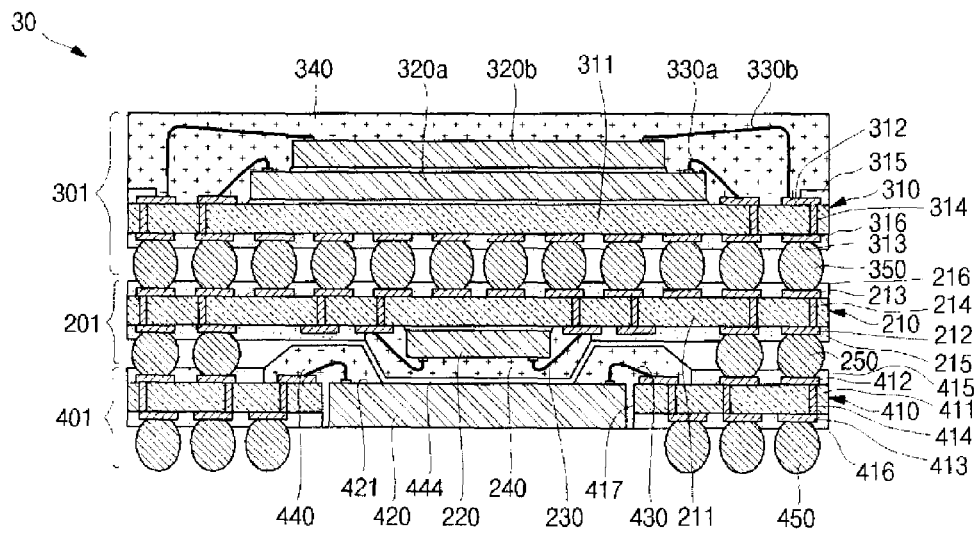
FIG. 4A is a cross-sectional view of a chip stack assembled to include one of semiconductor packages shown in FIG. 3A.
Figure 10:
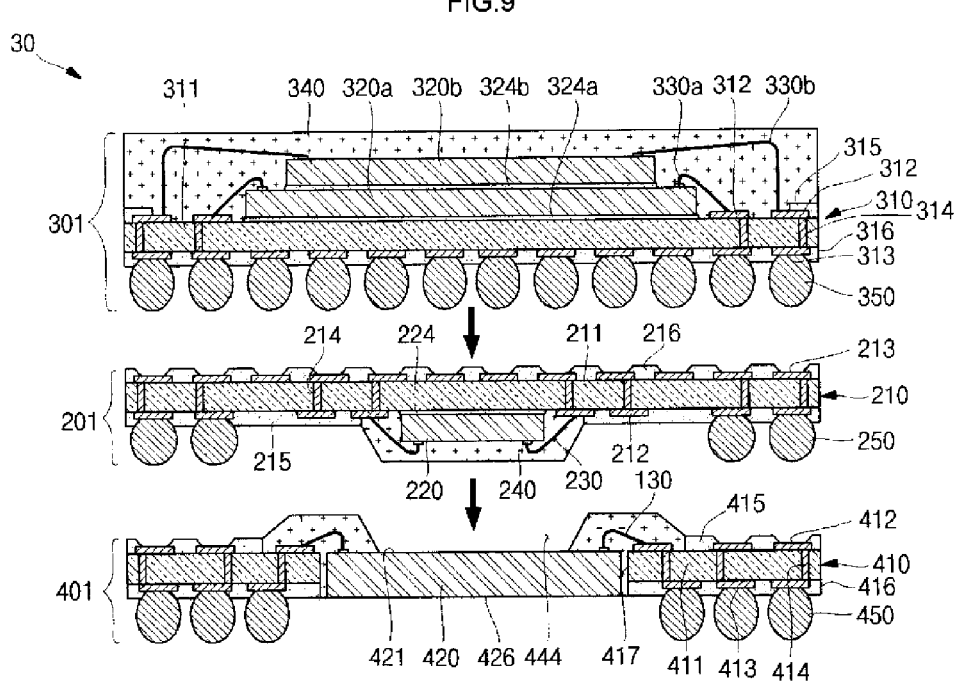
FIG. 10 is an exploded view of the chip stack shown in FIG. 4A.

Referring now to FIG. 4A, there is shown a semiconductor package stack 30 which comprises a relatively minor variant of the semiconductor package stack 10 shown in FIG. 2A. FIG. 10 provides an exploded view of the stack 30 shown in FIG. 4A. The only distinction between the stacks 10, 30 is that the semiconductor package 101 in the stack 10 is substituted with the semiconductor package 401 shown in FIG. 3A in the stack 30.

Figure 4B:
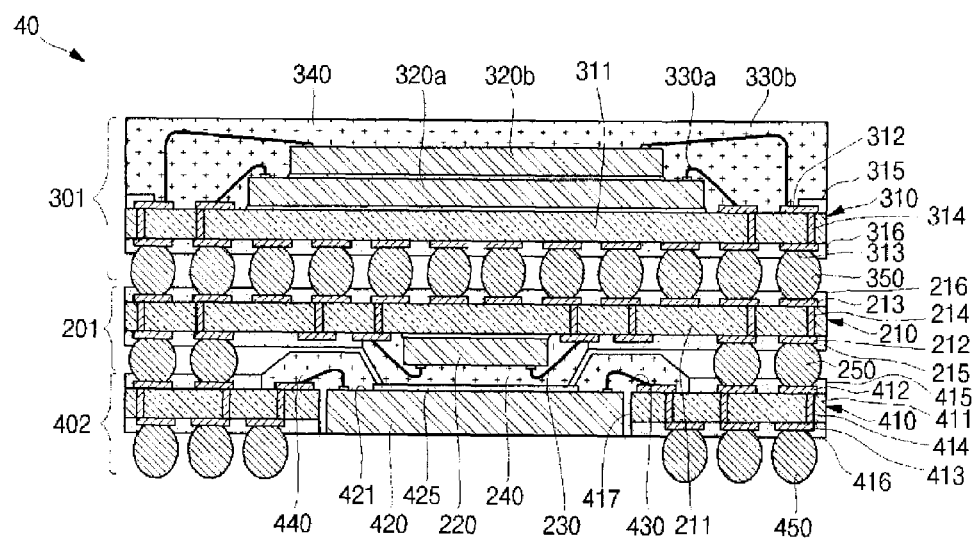
FIG. 4B is a cross-sectional view of a variant of the chip stack shown in FIG. 4A and assembled to include one of semiconductor packages shown in FIG. 3B.
Figure 11:
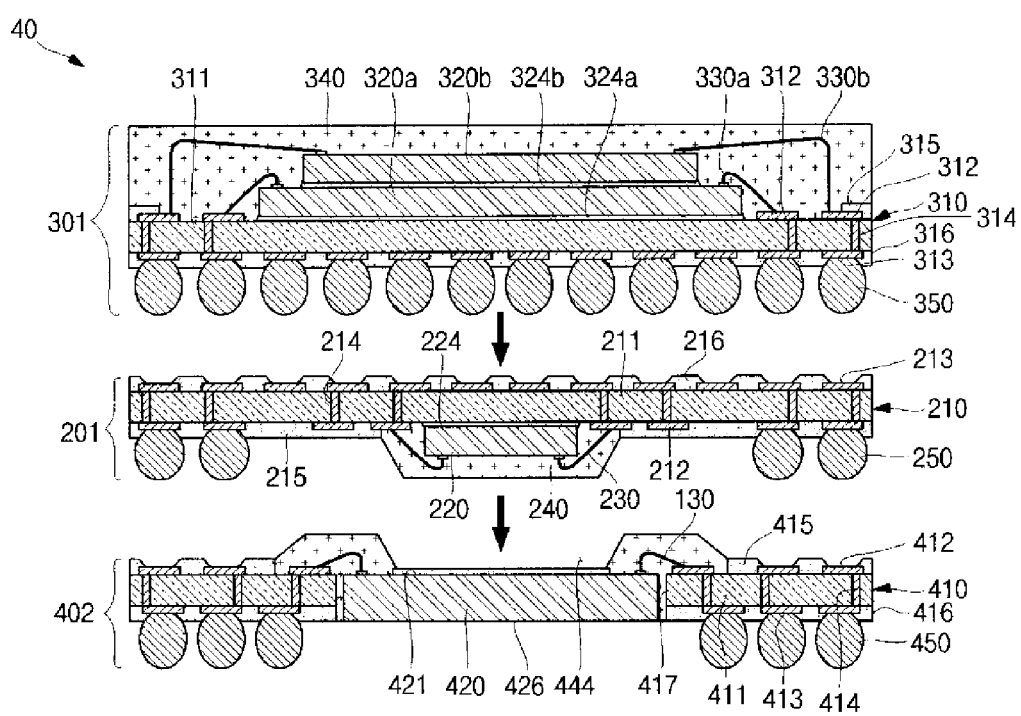
FIG. 11 is an exploded view of the chip stack shown in FIG. 4B.

Referring now to FIG. 4B, there is shown a semiconductor package stack 40 which comprises a relatively minor variant of the semiconductor package stack 30 shown in FIG. 4A. FIG. 11 provides an exploded view of the stack 40 shown in FIG. 4B. The only distinction between the stacks 30, 40 is that the semiconductor package 401 in the stack 30 is substituted with the semiconductor package 402 shown in FIG. 3B in the stack 40. Thus, in the stack 40, when the semiconductor package 201 is vertically stacked upon and electrically connected to the underlying semiconductor package 402, the package body 240 of the semiconductor package 201 will typically directly engage the protective layer 425 disposed on the top surface 421 of the semiconductor die 420 in the underlying semiconductor package 402 in the manner shown in FIG. 4B.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
a substrate including:
opposed top and bottom substrate surfaces and a substrate side surface which extends between the top and bottom substrate surfaces;
a conductive circuit pattern disposed on the top substrate surface; and
a plurality of conductive contacts disposed on the bottom substrate surface, each of the contacts being electrically connected to the circuit pattern;
at least one semiconductor die defining opposed top and bottom surfaces, the semiconductor die being electrically connected to the circuit pattern of the substrate by conductive wires; and
a package body comprising separate first and second package body sections which at least partially encapsulate the semiconductor die, the conductive wires and the substrate such that at least a portion of the top surface of the semiconductor die is not covered by the first and second package body sections, and the conductive wires are covered thereby, the first and second package body sections each having a first surface which extends to the top surface of the semiconductor die, a third surface which extends to the top substrate surface of the substrate and is disposed inward of the substrate side surface, and a second surface which extends between the first and third surfaces, the top surface of the semiconductor die and the first surfaces of the first and second package body sections collectively defining a recess which is of a prescribed depth.

2. The semiconductor package of claim 1 wherein the semiconductor die defines a die side surface, and the first and second package body is sections are each formed to cover at least a portion of the die side surface.

3. The semiconductor package of claim 1 wherein the first surface extends at an angle of greater than about ninety degrees relative to the portion of the top surface of the semiconductor die which is not covered by the first and second package body sections.

4. The semiconductor package of claim 1 further comprising a protective layer applied to the portion of the top surface of the semiconductor die which is not covered by the first and second package body sections.

5. The semiconductor package of claim 4 wherein the first surface of each of the first and second package body sections further extends into contact with the protective layer.

6. The semiconductor package of claim 4 wherein the protective layer is a thermal conductor of predetermined thickness.

7. The semiconductor package of claim 1 further in combination with a second semiconductor package electrically connected to the semiconductor package and having a package body which is complementary to and received into the recess in a nesting fashion when the second semiconductor package is electrically connected to the semiconductor package.

8. The semiconductor package of claim 1 wherein the bottom surface of the semiconductor die is attached to the top substrate surface of the substrate.

9. The semiconductor package of claim 1 wherein at least a portion of the bottom surface of the semiconductor die is exposed in the bottom substrate surface of the substrate.

10. The semiconductor package of claim 1 further comprising a plurality of solder balls disposed on respective ones of the contacts.

11. A semiconductor package stack, comprising:
a first semiconductor package comprising:
  a substrate including a conductive circuit pattern and a plurality of conductive contacts which are each electrically connected to the circuit pattern;
  at least one semiconductor die defining opposed top and bottom surfaces and a side surface, the semiconductor die being electrically connected to the circuit pattern of the substrate; and
  a package body partially encapsulating the semiconductor die and the substrate such that at least a portion of the top surface of the semiconductor die is not covered by the package body and at least a portion of the circuit pattern of the substrate is covered by the package body, the package body and the top surface of the semiconductor die collectively define a recess;
a second semiconductor package comprising:
  a substrate including a conductive circuit pattern and a plurality of conductive contacts which are each electrically connected to the circuit pattern, the circuit pattern of the second semiconductor package being electrically connected to the circuit pattern of the first semiconductor package;
  at least one semiconductor die electrically connected to the circuit pattern of the substrate of the second semiconductor package; and
  a package body covering the semiconductor die and at least a portion of the circuit pattern of the second semiconductor package, the package body of the second semiconductor package having a configuration which is complimentary to the recess of the first semiconductor package;
the package body of the second semiconductor package being nested within the package body of the first semiconductor package when the circuit pattern of the second semiconductor package is electrically connected to the circuit pattern of the first semiconductor package, the package bodies of the first and second semiconductor packages being oriented relative to each other such that an open, narrow gap is defined therebetween.

12. The stack of claim 11 wherein package bodies of the first and second semiconductor packages are sized and configured relative to each other such that the open, narrow gap defined between the package body of the second semiconductor package and the package body of the first semiconductor package is of a substantially uniform width.

13. The stack of claim 11 wherein the first semiconductor package further comprises a protective layer applied to the portion of the top surface of the semiconductor die of the first semiconductor package which is not covered by the package body thereof, and the package body of the second semiconductor package directly engages the protective layer when the circuit pattern of the second semiconductor package is electrically connected to the circuit pattern of the first semiconductor package.

14. The stack of claim 11 further in combination with a third semiconductor package which is electrically connected to the second semiconductor package.

15. A semiconductor package comprising:
a substrate including a conductive circuit pattern and a plurality of conductive contacts electrically connected to the circuit pattern;
at least one semiconductor die attached to the substrate and defining opposed top and bottom surfaces and a plurality of side surfaces, the semiconductor die including a plurality of terminals which are disposed on the top surface thereof and arranged in at least two rows which extend along respective ones of an opposed pair of the side surfaces, at least some of the terminals being electrically connected to the circuit pattern of the substrate; and
separate first and second package body sections partially encapsulating the substrate and the semiconductor die such that each of the first and second package body sections covers the terminals of one of the rows thereof and a corresponding one of the opposed pair of the side surfaces, at least a portion of the top surface of the semiconductor die not being covered by the first and second package body sections, with at least a portion of the circuit pattern of the substrate being covered thereby.

16. The semiconductor package of claim 15 wherein the semiconductor die is electrically connected to the circuit pattern by conductive wires which are covered by the first and second package body sections.

17. The semiconductor package of claim 15 wherein the first and second package body sections and the top surface of the semiconductor die collectively define a recess having a prescribed depth.

18. The semiconductor package of claim 17 wherein the first and second package body sections each define a first surface which extends to the top surface of the semiconductor die, a third surface which extends to the substrate, and a second surface which extends between the first and third surfaces, the recess being collectively defined by the top surface of the semiconductor die and the first surfaces of the first and second package body sections.

* * * * *